(12) United States Patent
Lemke

(10) Patent No.: US 10,748,587 B2
(45) Date of Patent: Aug. 18, 2020

(54) MEMORY CIRCUITS AND A METHOD FOR FORMING A MEMORY CIRCUIT

(71) Applicant: Infineon Technologies AG, Neubiberg (DE)

(72) Inventor: Marko Lemke, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 394 days.

(21) Appl. No.: 14/843,484

(22) Filed: Sep. 2, 2015

(65) Prior Publication Data
US 2016/0071565 A1 Mar. 10, 2016

(30) Foreign Application Priority Data

Sep. 10, 2014 (DE) ......... 10 2014 113 030

(51) Int. Cl.
| | |
|---|---|
| *G11C 8/00* | (2006.01) |
| *H01G 11/06* | (2013.01) |
| *H01L 45/00* | (2006.01) |
| *H01L 27/108* | (2006.01) |
| *H01G 11/50* | (2013.01) |
| *H01M 10/42* | (2006.01) |
| *H01L 27/24* | (2006.01) |
| *G11C 5/14* | (2006.01) |

(52) U.S. Cl.
CPC .............. *G11C 8/00* (2013.01); *G11C 5/141* (2013.01); *G11C 5/147* (2013.01); *H01G 11/06* (2013.01); *H01G 11/50* (2013.01); *H01L 27/1085* (2013.01); *H01L 27/10805* (2013.01); *H01L 27/2463* (2013.01); *H01L 45/085* (2013.01); *H01L 45/1233* (2013.01); *H01L 45/142* (2013.01); *H01L 45/145* (2013.01); *H01L 45/1675* (2013.01); *H01M 10/425* (2013.01); *Y02E 60/13* (2013.01)

(58) Field of Classification Search
CPC ... G11C 11/24; G11C 13/009; G11C 13/0011; G11C 13/0014; G11C 5/141; H01G 11/50; H01M 10/052
See application file for complete search history.

(56) References Cited

U.S. PATENT DOCUMENTS

| | | | |
|---|---|---|---|
| 4,224,390 A | 9/1980 | Haering et al. | |
| 2001/0032666 A1 | 10/2001 | Jenson et al. | |
| 2002/0068222 A1* | 6/2002 | Ishii ................. | H01M 4/628 |
| | | | 429/347 |
| 2004/0027849 A1* | 2/2004 | Yang ................. | B82Y 10/00 |
| | | | 365/115 |

(Continued)

FOREIGN PATENT DOCUMENTS

| | | |
|---|---|---|
| DE | 102006038077 A1 | 1/2008 |
| DE | 102014101058 A1 | 8/2014 |

(Continued)

*Primary Examiner* — Douglas King
(74) *Attorney, Agent, or Firm* — Murphy, Bilak & Homiller, PLLC

(57) ABSTRACT

A memory circuit includes a memory element which includes a first electrode layer including lithium. The memory element further includes a second electrode layer and a solid-state electrolyte layer arranged between the first electrode layer and the second electrode layer. The memory circuit also includes a memory access circuit configured to determine a memory state of the memory element.

19 Claims, 4 Drawing Sheets

(56) References Cited

U.S. PATENT DOCUMENTS

| | | | |
|---|---|---|---|
| 2006/0038169 A1* | 2/2006 | Mandell | B82Y 10/00 |
| | | | 257/40 |
| 2007/0161186 A1* | 7/2007 | Ho | B82Y 10/00 |
| | | | 438/257 |
| 2008/0043515 A1* | 2/2008 | Bloch | G11C 13/02 |
| | | | 365/153 |
| 2008/0106929 A1* | 5/2008 | Meyer | G11C 13/0007 |
| | | | 365/153 |
| 2008/0232160 A1 | 9/2008 | Gopalakrishnan | |
| 2009/0029237 A1* | 1/2009 | Yazami | H01M 4/38 |
| | | | 429/50 |
| 2011/0281173 A1* | 11/2011 | Singh | H01M 2/16 |
| | | | 429/306 |
| 2013/0056698 A1* | 3/2013 | Satoh | H01L 27/101 |
| | | | 257/2 |
| 2013/0112110 A1 | 5/2013 | Stevenson et al. | |
| 2013/0200329 A1 | 8/2013 | Mege | |
| 2014/0233200 A1 | 8/2014 | Lemke et al. | |

FOREIGN PATENT DOCUMENTS

| | | |
|---|---|---|
| JP | H06224386 A | 8/1994 |
| JP | 2009224776 A | 10/2009 |
| KR | 20040075022 A | 8/2004 |

\* cited by examiner

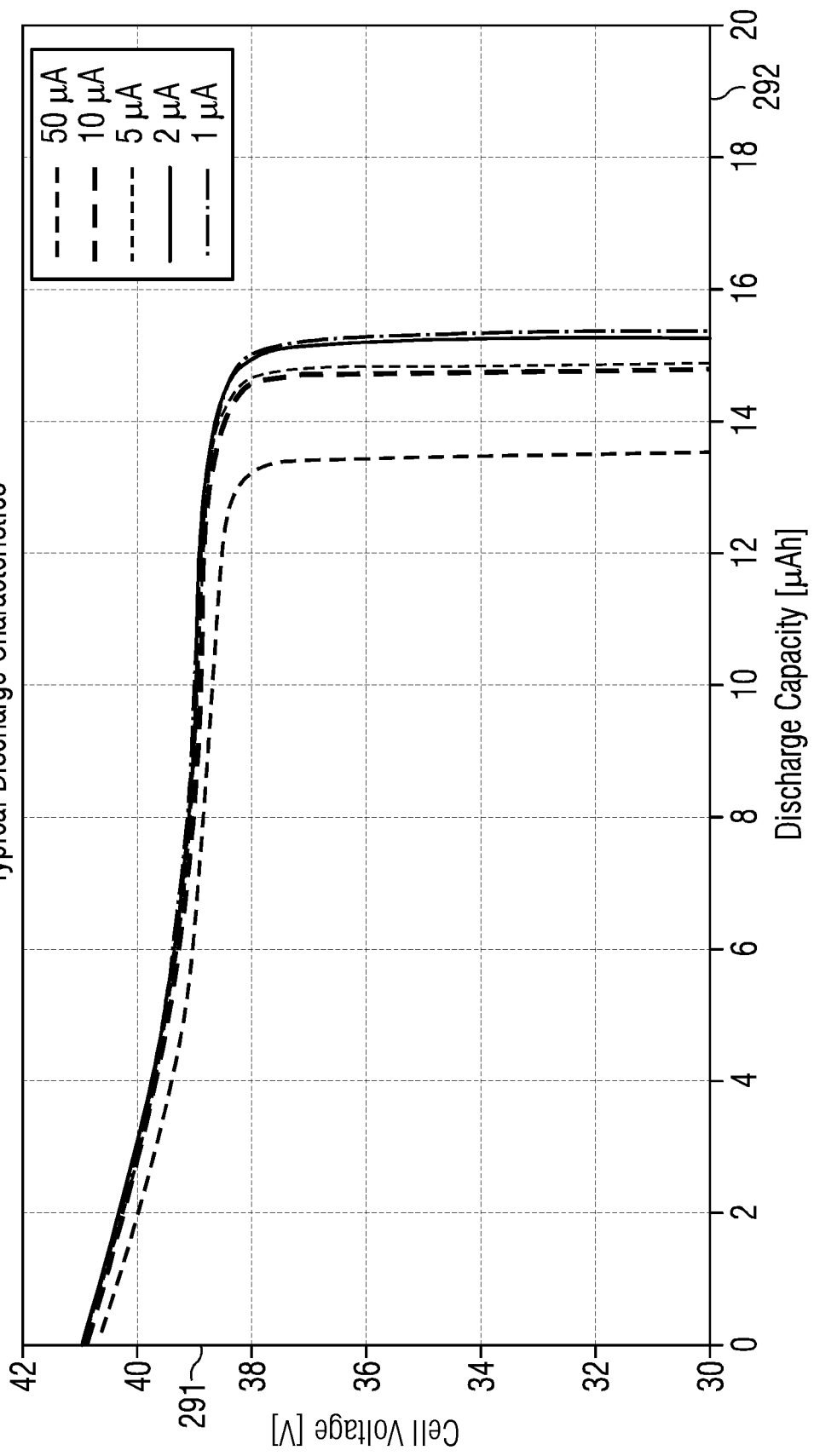

MEMORY CIRCUITS AND A METHOD FOR FORMING A MEMORY CIRCUIT

PRIORITY CLAIM

This application claims priority to German Patent Application No. 10 2014 113 030.8 filed on 10 Sep. 2014, the content of said application incorporated herein by reference in its entirety.

TECHNICAL FIELD

Embodiments relate to information storage devices and in particular to memory circuits and a method for forming a memory circuit.

BACKGROUND

Various memory architectures have been used for storing and retrieving data information. Such architectures include dynamic random access memory (DRAM), flash memory, static random access memory (SRAM) and magnetoresistive random access memory (MRAM), for example. Low-cost memory using non-complex manufacturing technologies, which may be easily integrated with other circuits are desired, for example.

SUMMARY

Some embodiments relate to a memory circuit. The memory circuit includes a memory element which includes a first electrode layer including lithium. The memory element further includes a second electrode layer and a solid-state electrolyte layer arranged between the first electrode layer and the second electrode layer. The memory circuit includes a memory access circuit configured to determine a memory state of the memory element.

Some embodiments relate a method for forming a memory circuit. The method includes forming a first electrode layer including lithium over a substrate surface. The method includes forming a solid-state electrolyte layer over the first electrode layer. The method includes forming a second electrode layer over the solid state electrolyte. The method includes etching the second electrode layer and the solid-state electrolyte layer so that at least one memory element stack of a memory element remains.

Those skilled in the art will recognize additional features and advantages upon reading the following detailed description, and upon viewing the accompanying drawings.

BRIEF DESCRIPTION OF THE FIGURES

Some embodiments of apparatuses and/or methods will be described in the following by way of example only, and with reference to the accompanying figures, in which

FIG. 2C shows a plot of cell voltage in a memory element in relation to discharge capacity according to an embodiment;

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
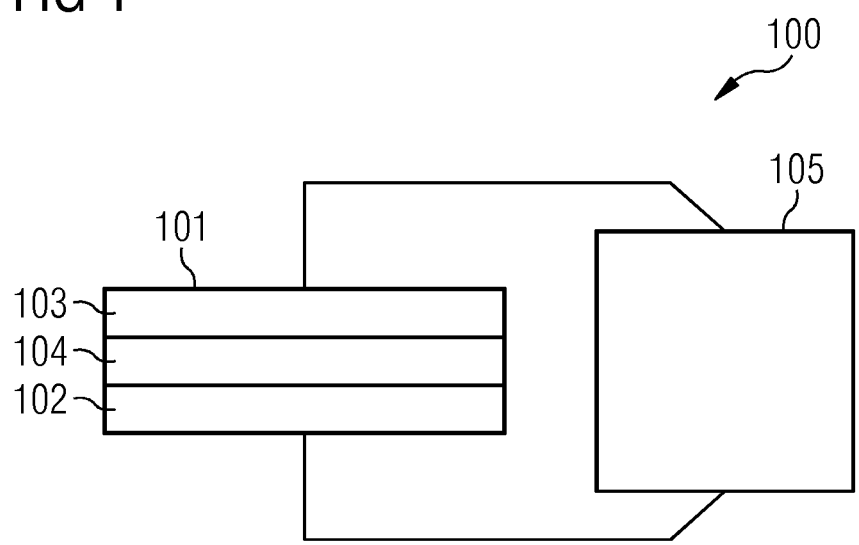
FIG. 1 shows a schematic illustration of a memory circuit according to an embodiment.

FIG. 1 shows a schematic illustration of a memory circuit 100 according to an embodiment.

The memory circuit 100 includes a memory element 101 which includes a first electrode layer 102 including lithium. The memory element 101 further includes a second electrode layer 103 and a solid-state electrolyte layer 104 arranged between the first electrode layer 102 and the second electrode layer 103. The memory circuit 100 includes a memory access circuit 105 configured to determine a memory state of the memory element 101.

By forming a memory element having a lithium-based electrode layer, a programmable memory element may be obtained, which may be programmed between a plurality of memory states, for example. Very low self-discharge memory cell may be obtained without need for refreshing, for example. Due to the memory cell having a solid-state electrolyte layer, the memory element may be easy to integrate in any Application Specific Integrated Circuit (ASIC), for example. The memory element may be easily monolithically integrated with on-chip battery solutions which may also include a lithium-based battery electrode layer, for example. Furthermore, fabrication may be simplified due shared or common processes arising during production, for example. Due to reduced complexity, the memory element may also be produced at low or reduced costs, for example.

The first electrode layer 102 (e.g. a cathode layer) may include lithium and may be formed above the semiconductor substrate, for example. For example, the first electrode layer 102 may include or consist of lithium cobalt oxide $LiCoO_2$. A first collector layer (or barrier layer) may also be arranged in contact with the first electrode layer 102, for example. The first collector layer may be formed between the semiconductor substrate and the first electrode layer 102, for example.

The solid-state electrolyte layer 104 may include or consist of lithium phosphorus oxynitride (LiPON), for example. The solid-state electrolyte layer 104 may be formed on (e.g. directly on) the first electrode layer 102, for example. A solid state electrolyte may be regarded as a material which may transport electrical charge due to the movement of ions in the material, e.g., through channels, voids, or empty crystallographic positions in their crystal structure, for example.

The second electrode layer 103 (e.g. an anode layer) may include or consist of carbon C or silicon Si, for example, and may be formed on (e.g. directly on) the solid-state electrolyte layer 104, for example. A second collector layer (or barrier layer) may be arranged in contact with the second electrode layer 103, for example.

The first collector layer and the second collector layer may each include or consist of titanium nitride TiN, tungsten nitride WN, copper Cu or aluminum Al, for example.

It may be sufficient to form only one first electrode layer 102, solid-state electrolyte layer 104 and second electrode layer 103 for implementing a memory element stack. Alternatively, a plurality of memory element stacks may be formed.

The memory element 101 may be used to store information. For example, the memory element may be configured to be programmed to one or more predefined memory states or bit states. In an example, a memory element may be configured to be programmed between two memory states, e.g. to a bit "1" or to a bit "0". In other examples, a memory element may be configured to be programmed to one of three or four or more predefined memory states, e.g. multi-bit memory. A predefined memory state may be a state in which the memory element 101 provides a voltage within a predefined voltage range, for example.

The memory element 101 may be programmed to the one or more predefined memory states based on a bias voltage or current applied between the first electrode layer 102 and the second electrode layer 103. For example, the memory element 101 may be configured to switch to a predefined memory state or one of a plurality of predefined memory states based on a predefined write bias level (voltage or current) applied by the memory access circuit 105 between the first electrode layer 101 and the second electrode layer 103. For example, the memory element 101 may be configured to switch to one of a plurality of predefined memory states based on a transport of ions to the first electrode layer 102 or the second electrode layer 103 via the solid-state electrolyte layer 104.

Based on a bias (voltage or current) applied between the first electrode layer 102 and the second electrode layer 103, lithium ions may be generated at the first electrode layer 102, for example. For example, based on a first predetermined write bias level e.g. a predetermined positive bias voltage or potential applied to the first electrode layer 102 (the cathode layer) with respect to the second electrode layer 103, lithium ions may be generated at the first electrode layer 102 and transported towards and/or collected at the second electrode layer 103. The second electrode layer 103 may include a plurality of crystalline layers (e.g. silicon layers or graphite layers) and the lithium ions collected at the second electrode layer 103 may be stored and/or intercalated in the plurality of crystalline layers of the second electrode layer 103, for example. The first predetermined write bias level may be a voltage signal, for example. The first predetermined write bias level may be slightly above the cell voltage, for example. For example, the first predetermined write bias level may be between 3.5 V to 5 V, for example, or e.g. between 4 V to 5 V, for example.

The cell may be empty (e.g. approximately 0 V) in the second predefined memory state or charged in the first predefined memory state, for example. The transport of lithium ions and the storage or intercalation of ions at the second electrode layer 103 may result in a first memory state voltage between the first electrode layer and the second electrode layer, for example. In other words, the memory element 101 may be switched or programmed to a first predefined memory state, for example. For example, the first memory state voltage present between the first electrode layer and the second electrode layer may be between 3 V to 5V or e.g. between 3.8 V and 4.1 V in the first predefined memory state, for example.

Based on a second predetermined write bias level (e.g. a predetermined negative bias applied to the first electrode layer 102 compared to the second electrode layer 103), lithium ions may be transported back towards and/or collected at the first electrode layer 102, for example. The lithium ions collected at the first electrode layer 102 may be intercalated or may recombine with the first electrode layer 102, for example. This may result in a second memory state voltage between the first electrode layer and the second electrode layer, for example. In other words, the memory element 101 may be switched or programmed to a second predefined memory state, for example. For example, the second memory state voltage may be approximately 0 V in the second predefined memory state, for example.

The memory access circuit 105 may be configured to determine a predefined memory state (e.g. a first predefined memory state or second predefined memory state) of the memory element based on a measurement of a memory state voltage between the first electrode layer 102 and the second electrode layer 103, for example. For example, the memory access circuit 105 may sense or detect the first predefined memory state (e.g. bit state "1") if a first memory state voltage level is detected. Similarly, the memory access circuit 105 may sense or detect the second predefined memory state (e.g. bit state "0") if a second memory state voltage level is detected, for example.

A reversible chemical reaction occurring at the first electrode layer 102 may be represented as follows: $LiCoO_2 \Leftrightarrow Li_{1-n}CoO_2 + nLi^+ + ne^-$. A reversible chemical reaction occurring at the second electrode layer 103 may be represented as follows: $nLi^+ + ne^- + C \Leftrightarrow Li_nC$. The predefined memory states of the memory element may be based on the chemical reactions of the first electrode layer, the second electrode layer and the solid state electrolyte, for example.

For example, the predefined memory state voltages may be based on standard electrochemical potential values related to the chemical reactions of the solid electrolyte 104, the first electrode layer 102 and the second electrode layer 103, for example.

Due to the implementation of a memory cell having a lithium-based electrode layer, the memory cell may be programmed (e.g. charged or discharged) between a plurality of discrete predefined memory states, for example. Very low self-discharge (less than 2% per year) may be obtained without need for refreshing, in comparison to other DRAM systems which may require refreshing every 100 to 200 ms, for example. Furthermore, the use of a solid-state electrolyte in comparison to liquid electrolytes reduces the complexity of the memory element fabrication process, for example. Furthermore, complex trenches and processes associated with flash memory cells may be avoided, for example.

The memory element 101 and the memory access circuit 105 may be formed at or on a common (e.g. a shared or the same) semiconductor substrate. The semiconductor substrate may include at least part of a semiconductor wafer (e.g. a die) or may be a whole semiconductor wafer, for example. The semiconductor substrate may be a silicon-based semiconductor substrate, a silicon carbide-based semiconductor substrate, a gallium arsenide-based semiconductor substrate or a gallium nitride-based semiconductor substrate, for example. The semiconductor substrate may include one or more application specific integrated circuits (ASIC) formed in the semiconductor substrate for the operation of the memory circuit 200, for example. Alternatively, the memory element 101 and the memory access circuit 105 may be formed at difference semiconductor dies connected to each other. The memory access circuit 105 may control a plurality of memory elements arranged on a common semiconductor die or on a different semiconductor die, for example.

The memory circuit may include a plurality of memory elements arranged in an array. In case of an array arrangement, an access transistor may be needed, for example. The memory elements of the memory circuit 100 may be formed in the common (same) semiconductor substrate or die, for example. For example, the memory element array may be a two-dimensional array of memory elements, for example. The memory element array may be arranged in a matrix formation in rows and columns, for example. For example, a memory element may be arranged at an intersection between a bit line from a set of bit lines and a word line from a set of word lines. For example, a memory element of the memory element array may be individually addressed (or selected) based on a bias level applied between a designated word line and a designated bit line. For example, selected memory elements of the memory element array may be written to or read based on a bias level applied to a designated bit line.

Figure 2A:
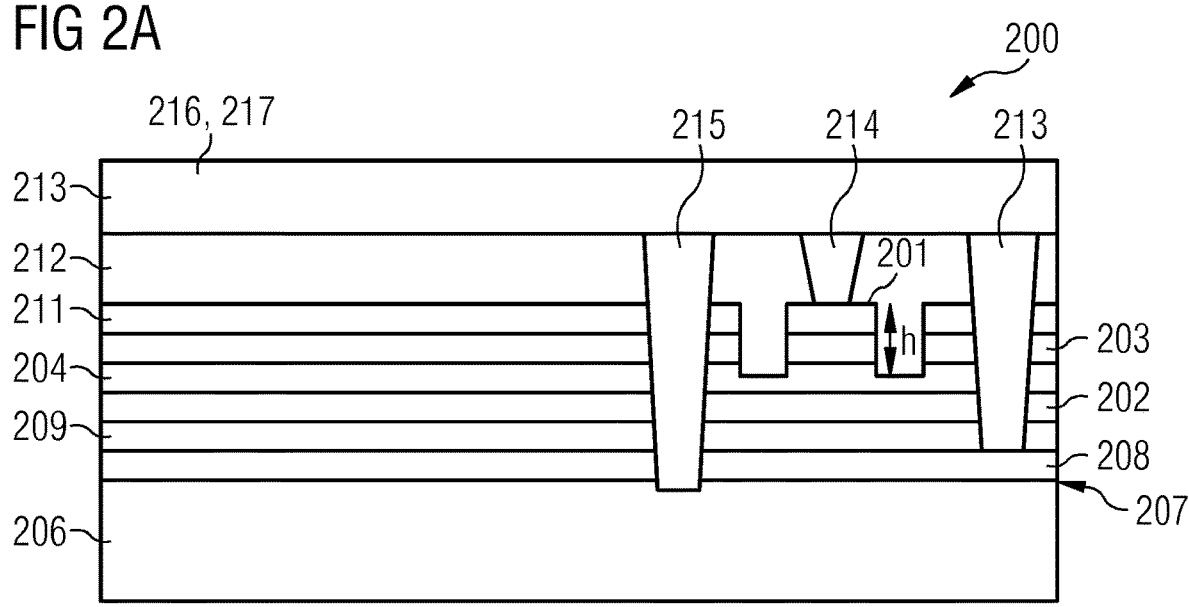
FIG. 2A shows a schematic illustration of a further memory circuit according to an embodiment.

FIG. 2A shows a schematic illustration of a memory circuit 200 according to an embodiment. The memory circuit 200 may be similar to the memory circuit described with respect to FIG. 1, for example.

As shown in the cross-sectional view of the schematic illustration of FIG. 2A, the memory circuit 200 may be formed at a semiconductor substrate 206. The semiconductor substrate 206 may include a semiconductor wafer with any ASIC, for example. For example, a memory access circuit of the memory circuit 200 may include one or more application specific integrated circuits (ASIC) formed in the substrate of the semiconductor substrate for the operation of the memory circuit 200. The memory access circuit may be formed below a defined substrate surface level 207, which may be found at an interface between the substrate and an electrically insulating layer 208, for example.

The electrically insulating layer 208 may be formed on (e.g. directly on) or above the substrate surface level 207. The electrically insulating layer 208 may include silicon dioxide or silicon nitride, for example, or any suitable material for providing an electrical insulation between the semiconductor substrate surface and the first collector layer 209. The electrically insulating layer 208 may have a thickness between 10 nm to 10 µm, or e.g. between 10 nm to 2 µm, or e.g. between 10 nm to 500 nm, for example.

The memory element 201 may include a first collector layer 209 formed on (e.g. directly on) the electrically insulating barrier layer 208, for example. The memory element 201 may include a first electrode layer 202 formed on (e.g. directly on) the first collector layer 209, for example. The first collector layer 209 and the first electrode layer 202 may be in electrical contact or in electrical connection with each other. The memory element 201 may further include a solid-state electrolyte layer (or film) 204 formed on (e.g. directly on) the first electrode layer 202, for example. The memory element 201 may include a second electrode layer 203 formed on (e.g. directly on) the solid-state electrolyte layer 204, for example. The memory element 201 may include a second collector layer 211 formed on (e.g. directly on) the second electrode layer 203, for example.

The first electrode layer 202 (e.g. the cathode layer) may include or consist of lithium cobalt oxide $LiCoO_2$, for example. Alternatively or additionally, the first electrode layer 202 may include cobalt, nickel, aluminum, oxygen, iron, phosphorous, sulfur, manganese, vanadium, manganese spinel, lithium nickel manganese cobalt, lithium iron phosphate (doped or undoped), transition metal oxides (e.g., $MnO_2$, $Fe_3O_4$, $Co_3O_4$, $TiO_2$, $NiO$), olivine (e.g., $LiCoPO_4$), $LiCoO_2$, $LiNiO_2$, $LiNi_xMn_yO_2$, $LiNi_{1-x}Co_xO_2$, $LiNi_{0.85}Co_{0.1}Al_{0.05}O_2$, $LiNi_{0.33}Co_{0.33}Mn_{0.33}O_2$, $LiMn_2O_4$ (spinel structure), $Li_{4/3}Ti_{5/3}O_4$, $V_2O_5$, amorphous $V_2O_5$, $LiMn_2O_4$, $Li_2S$, and $LiFePO_4$, a combination of these materials, or any other suitable cathode material, e.g. including nickel or stainless steel. The first electrode layer 202 may have a thickness between 10 nm to 10 µm, or e.g. between 10 nm to 2 µm, or e.g. between 10 nm to 500 nm, for example.

The solid-state electrolyte layer 204 may comprise or may consist of lithium phosphorus oxynitride LiPON or another solid state electrolyte. Alternatively or additionally, the electrolyte layer may include lithium, phosphorus, lanthanum, titanium, lithium phosphorus oxynitride, lithium lanthanum titanium oxide (LLTO), a polymer, poly oxyethylene, $LiPO_{1-x}N_{1-y}$, thio-LISICON materials (lithium superionic conductor, e.g. $Li_{10}GeP_2S_{12}$ or $Li_xGe_yP_zS_4$), $Li_xM_{1-y}M'_yS_4$ (M=Si or Ge, and M'=P, Al, Zn, Ga, or Sb), $Li_xAl_yTi_z(PO_4)$, Silicon Oxide ($SiO_2$), Silicon Nitride $Si_3N_4$, a combination of these materials, or any other suitable electrolyte, e.g., sodium super ion conductors (NASICON), NASICON type materials (e.g., $Na_{1+x+4y}M_{2-y}Si_xP_{3-x}O_{12}$, $0 \leq x \leq 3$, $0 \leq y \leq 1$ (M=Ti, Hf, or Zr)), $Li_2S$ $P_2S_5$, $Li_2S$ $P_2S_5$ $SiS_2$, $Li_2S$ $SiS_2$, or oxysulfide glass (e.g., $[[Li_2S]_{0.6}[SiS_2]_{0.4}]_{1-x}[Li_xMO_y]_x$ (M=Si, P, Ge, B, Al, Ga, In)). The solid-state electrolyte layer 204 may have a thickness between may have a thickness between 10 nm to 10 µm, or e.g. between 10 nm to 2 µm, or e.g. between 10 nm to 500 nm, for example.

The second electrode layer 203 (e.g. the anode layer) may include or consist of silicon or carbon. Alternatively or additionally, the second electrode layer 203 may include, polysilicon, amorphous silicon, amorphous carbon, graphite, Li$_4$Ti$_5$O$_{12}$ (LTO), CuN$_3$, titanium oxide (TiO$_2$), a combination of these materials, or any other suitable anode material, as for example titanium, a metal silicide (e.g., calcium silicide, magnesium silicide, molybdenum silicide), Li$_{15}$Si$_4$, a lithium containing alloy (e.g., Li$_{22}$M$_5$/M (M=Ge, Sn, Pb, Si)), Li$_{4.4}$Si, Li$_{4.4}$Ge, tin-oxide based glasses (e.g., SnO—B$_2$O$_3$—P$_2$O$_5$—Al$_2$O$_3$), SnS—P$_2$S$_5$, Li$_2$S—P$_2$S$_5$, silicon containing transition metal nitrides (e.g., SiMxNy (M=Co, Ni, Cu)), Ni coated by TiO$_2$, Sn, Ge, Al, Pb, In, ZnO. The second electrode layer 203 may include a mixture of anode materials (as described before) or a mixture of an anode material with another additional material to provide a microcomposite material as anode material, for example. The second electrode layer 203 may have a thickness between may have a thickness between 10 nm to 10 μm, or e.g. between 10 nm to 2 μm, or e.g. between 10 nm to 500 nm, for example.

The first collector layer 209 may serve as a collector contact for the first electrode layer 202, for example. The second collector layer 211 may serve as a collector contact for the second electrode layer 203, for example. The first collector layer 209 and the second collector layer 211 may each include or serve as a diffusion barrier, for example. The first collector layer 209 and the second collector layer 211 may each comprise a barrier layer including or consisting of at least one of titanium nitride TiN and tungsten nitride WN, for example, or any suitable material or combination of materials which may be appropriate as a diffusion barrier. Additionally, the first collector layer 209 and the second collector layer 211 may each comprise an electrically conductive layer including or consisting of copper (Cu), platinum (Pt), aluminum (Al), aluminum-copper (Al—Cu), tungsten (W), gold (Au), carbon (C) or compositions or alloys of these materials, for example.

The memory element 201 may include an etched memory element stack or pillar comprising at least part of the solid-state electrolyte layer 204, the second electrode layer 203 and the second collector layer 211. A lateral size (or lateral surface area) of the memory element 201 may be less than 1 μm$^2$, or e.g. less than 0.5 μm$^2$, or e.g. less than 0.25 μm$^2$, for example. The lateral size or surface area may be an area in parallel to a surface of the semiconductor surface occupied by the memory element. For example, a lateral side length (e.g. length of a lateral side of the memory or a breadth of a lateral side of the memory) of the memory element may be less than 1 μm, for example. A vertical height h (perpendicular to the lateral side length) of the memory element stack may be between 30 nm to 30 μm, or e.g. between 30 nm to 6 μm, or e.g. between 30 nm to 1.5 μm, for example.

An isolation material 212 may electrically insulate the memory element 201 (including the memory element stack) from its surroundings. For example, the isolation material 212 may surround (at least partially or completely) the memory element 201, for example. For example, the isolation material 212 may electrically isolate the memory element 201 except for the connections to the first collector layer 209 and the second collector layer 211. For example, the isolation material 212 may cover regions of the first electrode layer 202 or the solid-state electrolyte layer 204 which are exposed by the etching of the memory element stack. The isolation material 212 may also further surround or be formed directly on sidewall regions of the memory element stack or pillar and may also cover or be formed directly on top side regions of the memory element stack (e.g. on or directly on the second collector layer 211). The isolation material 212 may include one or more layers (e.g. one, two or more layers) of similar or different electrically insulating materials, for example. The isolation material 212 may include silicon dioxide or silicon nitride, for example, or any suitable material for providing an electrical insulation for the memory element 201.

One or more conductive vias 213, 214, 215 may be formed in the isolation material 212 by forming one or more trenches at least partially through the isolation material 212 and filling the one or more trenches with a via material. For example, the via material may include an electrically conductive material (e.g. a metal). For example, the via material may include or consist of Cu, Pt, Al or Al—Cu, or compositions or alloys of these materials. A first contact via 213 may be in electrical contact with the first electrode layer 202 via the first collector layer 209, for example. For example, the first contact via 213 may provide an electrical connection to the first collector layer 209 (e.g. from a bit line or reference potential to the first collector layer 209), for example. A second contact via 214 may be in electrical connection with the second electrode layer 203 (the common cathode) via the second collector layer 211, for example. For example, the second contact via 214 may provide an electrical connection to the second collector layer 211 (e.g. from a bit line or reference potential to the second collector layer 211), for example. A third contact via 215 (e.g. an ASIC contact) may provide an electrical contact between a component of the memory access circuit (e.g. an access transistor or to an ASIC circuit) and the memory element 201, for example.

The memory circuit 200 may include one or more layers (e.g. one, two or more) of wiring 256, 257 which include electrically conductive lines, for example. For example, the memory circuit 200 may include a set of word lines 256 and a set of bit lines 257. The word lines and bit lines may be formed from electrically conductive materials, including or consisting of Cu, Pt, Al or Al—Cu, or compositions or alloys of these materials, for example.

More details and aspects are mentioned in connection with the embodiments described above or below (e.g. regarding the memory circuit, the memory element, the first electrode layer, the second electrode layer, the first collector layer, the second collector layer, the solid-state electrolyte, the memory access circuit, the access transistor and the word lines and bit lines). The embodiment shown in FIG. 2A may comprise one or more optional additional features corresponding to one or more aspects mentioned in connection with the proposed concept or one or more embodiments described above (e.g. FIG. 1) or below (e.g. FIGS. 2B to FIG. 4).

Figure 2B:
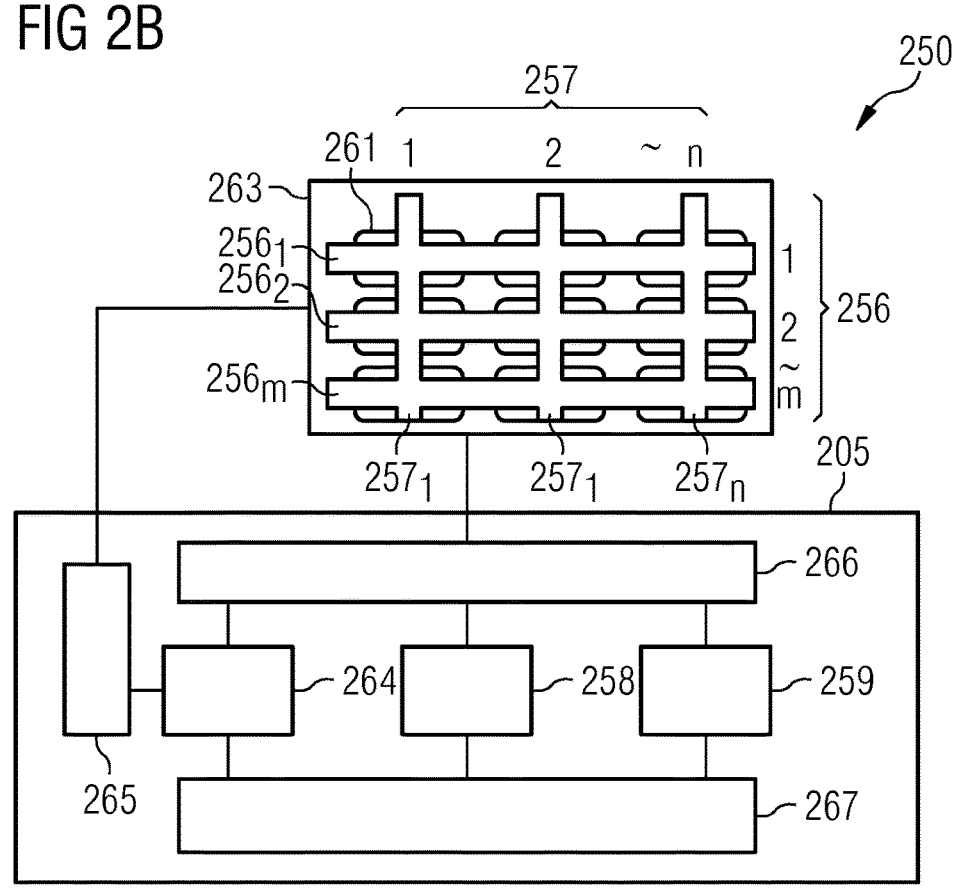
FIG. 2B shows a schematic illustration of a memory circuit including a memory element array according to an embodiment.

FIG. 2B shows a schematic illustration of a memory circuit 250 according to an embodiment. The memory circuit 250 may include a similar memory layer stack as shown in FIG. 2A.

As shown in the schematic illustration of FIG. 2B, the set of bit lines 257 (columns) may be arranged substantially perpendicularly to the set of word lines 256 (rows), for example. FIG. 2B also shows a top-view representation of the word lines 256, the bit lines 257 connected to memory elements of a memory element array 263. The set of bit lines 257 may be electrically isolated from the set of word lines 256, for example. For example, the set of bit lines 257 and the set of word lines 256 may each lie on different planes or levels or at (or in) different layers of the layer stack of the memory circuit 250. For example, the set of word lines 256 may be formed or arranged on a plane closer to the substrate surface level 207 than the set of bit lines 257. In some examples, the set of bit lines 257 and the set of word lines may be formed above the memory element. In other examples, the set of word lines 256 may be formed below the memory element and the set of bit lines 257 may be formed above the memory element, for example.

The memory circuit 250 may include a plurality of memory elements arranged in an array 263. The memory elements of the memory circuit 250 may be formed in the common (same) semiconductor substrate or die, for example. For example, the memory element array 263 may be a two-dimensional array of memory elements, for example. The memory element array 263 may be arranged in a matrix formation in rows and columns, for example. For example, a memory element may be arranged at an intersection between a bit line from the set of bit lines 257 (lines 1 to n) and a word line from the set of word lines 256 (lines 1 to m). For example, a memory element of the memory element array 263 may be individually addressed (or selected) based on a bias level applied between a designated word line (e.g. $256_1$) and a designated bit line (e.g. $257_1$). For example, selected memory elements of the memory element array 263 may be written to or read based on a bias level applied to a designated bit line.

The memory circuit 250 may further include at least one access transistor or a plurality of access transistors arranged in an array, for example. For example, the memory circuit 250 may include a 2-D array of access transistors. Each access transistor may be coupled to a memory element, for example. For example, each memory cell 261 may include a memory element (e.g. 201) coupled to an access transistor. A control terminal (e.g. a gate terminal) of the access transistor may be coupled to a word line, for example. A first terminal of the access transistor may be coupled to a reference potential or the bias generator circuit 258, for example. A second terminal may be coupled to the first electrode layer 202 of the memory element or the second electrode layer 203 of the memory element, for example.

In an example configuration (e.g. a common reference configuration) of a memory cell 261, a control terminal (e.g. a gate terminal) of the access transistor may be coupled to a word line, a first terminal (e.g. a source terminal) of the access transistor may be coupled to the bit line, and a second terminal (e.g. a drain terminal) of the access transistor may be coupled to the memory element. For example, the first electrode layer 202 and the first collector layer 209 of the memory element may be coupled to the second terminal (e.g. the drain terminal) of the access transistor, and the second electrode layer 203 and the second collector layer 211 of the memory element may be coupled to a reference potential (e.g. a ground potential).

In another example configuration (e.g. a common source configuration) of a memory cell 261, a control terminal (e.g. a gate terminal) of the access transistor may be coupled to the word line, a first terminal (e.g. a source terminal) of the access transistor may be coupled to a reference potential (e.g. a ground potential, and a second terminal (e.g. a drain terminal) of the access transistor may be coupled to the memory element. For example, the first electrode layer 202 and the first collector layer 209 of the memory element may be coupled to the second terminal (e.g. the drain terminal) of the access transistor, and the second electrode layer 203 and the second collector layer 211 of the memory element may be coupled to the bit line.

The memory access circuit 205 may be configured to individually address a memory element by applying a selection control signal to a control terminal of the access transistor. For example, the memory access circuit 205 may include a bias generator circuit 258 configured to provide a bias signal to the memory element or to a terminal of an access transistor coupled to the memory element to switch the memory element from a first predefined memory state to a second predefined memory state based on a predefined bias level of the bias signal. For example, the bias generator circuit 258 configured to provide a bias signal so that a potential difference may be formed between the first electrode layer 202 (via the first collector layer 209) and the second electrode layer 203 (via the second collector layer 211). For example, the bias generator circuit 258 may be configured to provide the bias to the memory element via a word line 256 and bit line 257.

During a write operation, the memory access circuit 205 may be configured to program the memory element to a predefined memory state. The bias generator circuit 258 may be configured to provide a selection control signal (e.g. a predefined selection bias level VDD) to a selected memory element via a designated word line (e.g. via the control terminal of the access transistor), and to provide a bias signal to the selected memory element via a designated bit line, for example. The bias signal provided by the bias generator circuit 258 may be configured to program the memory access circuit 205 to a predefined memory state of the plurality of memory states.

The bias generator circuit 258 may be configured to provide a first predefined bias level of the bias signal (e.g. a write bias level) to the memory element. The potential difference generated across the memory element by the first predefined bias level of the bias signal may cause lithium ions generated or delivered by the first electrode layer 202 to be transported towards and/or collected or stored at the second electrode layer 203, resulting in the memory element switching to a first predefined memory state, for example.

For example, a bias signal having a first write bias level provided by the bias generator circuit 258 may program the memory element to a first predefined memory state (e.g. to bit "1"), for example (e.g. by charging the memory element). The first write bias level may be a voltage or current signal (e.g. a constant current or a constant voltage signal) provided to the first electrode layer 202 via the bit line 257, for example. The provided first write bias level (e.g. the voltage or current signal) may cause oxidation of the first electrode layer 202 and may result in lithium ions being transported from the first electrode layer 202 to the second electrode layer 203 through the solid-state electrolyte 204, for example. In the first predefined memory state, a first memory state voltage may be present between the first electrode layer 202 and the second electrode 203.

The bias generator circuit 258 may be configured to provide a second predefined bias level of the bias signal (e.g. a second write bias level) to the memory element. The potential difference generated across the memory element by the second predefined bias level of the bias signal may cause lithium ions to be transported back towards and/or collected at the first electrode layer 202, resulting in the memory element switching to a second predefined memory state, for example. A bias signal having a second write bias level may program the memory element to a second predefined memory state (e.g. to bit "0"), for example (e.g. by discharging the memory element). The second write bias level may be a current signal provided to the first electrode layer 202 via the bit line 257, for example. The provided second write bias level (e.g. the current signal) may cause reduction of the first electrode layer 202, and may result in lithium ions being transported from the second electrode layer 204 to the first electrode layer 204 through the solid-state electrolyte 204, for example. In the second predefined memory state, a second memory state voltage may be present between the first electrode layer 202 and the second electrode 203.

In this manner, the memory element may be configured to switch between the first predefined memory state and the second predefined memory state based on a predefined bias level of the bias signal provided by the bias generator circuit 258 during a write operation, for example.

Although only two predefined memory states have been described with respect to the embodiments, the memory element may be configured to be programmed to a plurality of predefined memory states, e.g. more than two predefined memory states, based on the amount of charge or ions stored in the first 202 or the second 203 electrode layer, for example.

The predefined memory state voltages (e.g. the first memory state voltage, the second memory state voltage or other predefined memory state voltages) of the predefined memory states may be based on standard electrochemical potential values related to the solid electrolyte, the first electrode layer 202 and the second electrode layer 203, for example. For example, the first memory state voltage may be based on a substantially fully charged state of the memory cell (e.g. the second electrode layer 203 stores ions or charges to a level between 80% to 100% of its storage capacity). For example, the first memory state voltage may be based on a substantially fully charged state of the memory cell (e.g. the second electrode layer 203 stores ions or charges to a level between 80% to 100% of its storage capacity). For example, the second memory state voltage may be based on substantially fully discharged state of the memory cell (e.g. the second electrode layer 203 may store ions or charges to a level between 0% to 30% of its storage capacity).

FIG. 2C shows a plot 290 of cell voltage (V) 291 in relation to discharge capacity (μAh) 292. As shown in FIG. 2C, the memory element may be charged between 3.8 V to 4.1 V, or e.g. between 3 V and 5 V, for example. The region between 0 V and 3.5 V may be unused due to the high slope, for example.

The memory element may be configured to be programmed to one of three or four or more predefined memory states, e.g. multi-bit memory. For example, a first memory state level or voltage may be about 0 V, for example. A second memory state level or voltage may be about 3.8 V, for example. A third memory state level or voltage may be about 3.9 V, for example. A fourth memory state level or voltage may be about 4 V, for example.

During a read operation, the memory access circuit 205 may be configured to determine the memory state of the memory element. The memory access circuit 205 may include a sensing circuit 259 configured to determine the memory state of the memory element based on a voltage present between the first electrode layer 202 and the second electrode layer 203, for example. For example, the sensing circuit 259 may include one or more sense amplifier circuits coupled to the bit lines 257 of the memory circuit, for example. For example, the memory state of the memory element may be determined based on a voltage between the first electrode layer 202 and the second electrode layer 203, or a charge stored in the memory element. For example, the memory state of the memory element may be determined based on a voltage (or charge) present between the first electrode layer 202 and the second electrode layer 203 with respect to a reference value (e.g. a difference measurement), for example.

For example, the bias generator circuit 258 may include a pre-charge circuit configured to provide a pre-charge bias signal (e.g. at a pre-charge bias level VDD/2) to a pair of bit lines (e.g. a bit line 257 and a complementary bit line). For example, the bit lines 257 may be precharged to a voltage level between the first memory state voltage level and the second memory state voltage level, (e.g. between 3.7 V and 2.5 V), for example.

Subsequently, the bias generation circuit 258 may be configured to provide a selection read bias signal (e.g. at a selection read bias level, e.g. VDD) to turn on the selected memory element to be read via a designated word line. For example, the word line may turn on a row of memory elements controlled by the designated word line. Due to the access transistor being turned on charge transfer may occur between the memory element and its connected bit line, for example. A sense amplifier coupled between the bit line 257 and the complementary bit line may be configured to measure and/or amplify a difference in the voltage between the voltage sensed on the bit line 257 and the complementary bit line, for example. For example, if the voltage difference is positive, a first memory state value may be read. For example, if the voltage difference is negative, a second memory state value may be read.

As the read operation may result in the memory element losing charge, the memory access circuit 205 may also be configured to perform a refresh operation to recharge the memory elements to pre-read values after the read operation.

The memory access circuit 205 may include an addressing circuit 264 configured to provide one or more address signals corresponding to individual memory elements of the array 263. For example, the addressing circuit 264 may be configured to trigger a selection of one or more memory elements of the array 263. The memory access circuit may include a word line decoder circuit 265 and a bit line decoder circuit 266 coupled to the addressing circuit 264, for example. Each memory element of the memory element array 261 may be individually addressed based on the one or more address signals provided by the addressing circuit 264, for example.

The memory circuit 250 may operate as a standalone memory cell array, or the memory access circuit may include one or more additional control circuits 267 (e.g. ASIC or sensors), which may be coupled to the memory access circuit and the memory elements of the memory circuit 250.

Due to the implementation of a memory cell having a lithium-based electrode layer, the memory cell may be programmed (e.g. charged or discharged) into a plurality of discrete predefined memory states, for example. Very low self-discharge (less than 2% per year) may be obtained without need for refreshing, in comparison to other DRAM systems which may require refreshing every 100 to 200 ms, for example. Furthermore, the use of a solid-state electrolyte reduces the complexity of the fabrication process, for example.

More details and aspects are mentioned in connection with the embodiments described above or below (e.g. regarding the memory circuit, the memory element, the first electrode layer, the second electrode layer, the first collector layer, the second collector layer, the solid-state electrolyte, the memory access circuit, the bias generator circuit, the sensing circuit, the access transistor and the word lines and bit lines). The embodiment shown in FIGS. 2B and 2C may comprise one or more optional additional features corresponding to one or more aspects mentioned in connection with the proposed concept or one or more embodiments described above (e.g. FIG. 1) or below (e.g. FIG. 3 and FIG. 4).

Figure 3:
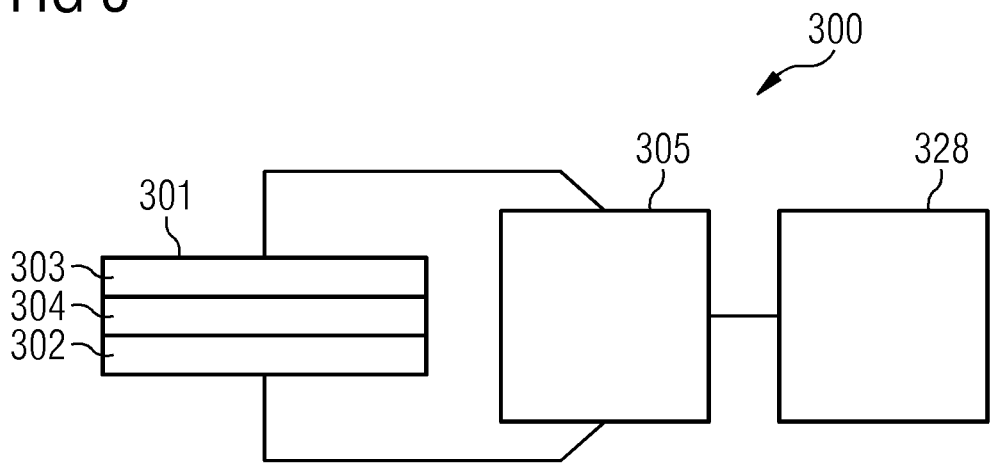
FIG. 3 shows a schematic illustration of a further memory circuit according to an embodiment.

FIG. 3 shows a memory circuit 300 according to an embodiment.

The memory circuit 300 includes a memory element 301 and a battery element 328. The battery element 328 is configured to provide stored charge to at least the memory access circuit 305 to supply energy for determining the memory state of the memory element 301. The memory element 301 includes a first electrode layer 302 including lithium. The memory element 301 further includes a second electrode layer 303 and a solid-state electrolyte layer 304 arranged between the first electrode layer 302 and the second electrode layer 303. The memory circuit 300 includes a memory access circuit 305 configured to determine a memory state of the memory element 301.

The memory element and the battery element 328 may be formed from similar materials, for example. For example, the first electrode layer 302 and the first battery electrode layer may be formed from similar or the same materials. For example, the first battery electrode layer may include lithium. For example, the second electrode layer 303 and the second battery electrode layer may be formed from similar or the same materials. For example, the solid-state electrolyte layer 304 and the solid-state battery electrolyte layer may be formed from similar or the same materials.

The battery element 328 and the memory element 301 may be formed on or at a common (or same) semiconductor substrate, for example. For example, the battery element 328 may include a solid-state battery element including a first battery electrode layer, a second battery electrode layer and a solid-state battery electrolyte layer arranged between the first battery electrode layer and the second battery electrode layer. For example, the battery element 328 may include a rechargeable solid-state lithium ion battery element having a lateral size greater than 10 times, e.g. greater than 20 times, or e.g. greater than 100 times the lateral size of the memory element 301, for example.

The memory circuit 300 may be further configured to include a bias generator circuit configured to provide a bias signal for programming the memory element and for charging the battery element, for example. For example, the bias generator circuit of the memory access circuit may be configured to provide a charging bias signal for charging the battery element, for example, so that lithium ions generated at the first battery electrode layer may be intercalated or stored at the second battery electrode layer, for example. The memory element may be programmed to one or more predefined memory states at least partially based on stored charged in the battery element, for example. Additionally or alternatively, the memory access circuit may be configured to read or determine one or more predefined memory states of the memory element based on stored charged in the battery element. Additionally or alternatively, the battery element may be configured to provide stored charge to one or more circuits in the memory access circuit 305, for example.

The charging bias signal level may be similar or different to the bias signal levels provided by the bias generator circuit for programming the memory states of the memory element, for example.

Due to the monolithic integration of a memory element and a battery element at a common semiconductor die, the battery element may be used for supplying energy to program the memory element, for example. Furthermore, the memory element and the battery element may be formed using one or more shared or common fabrication steps and production complexity may be reduced, for example.

More details and aspects are mentioned in connection with the embodiments described above or below (e.g. regarding the memory circuit, the memory element, the first electrode, the second electrode, the solid-state electrolyte and the memory access circuit). The embodiment shown in FIG. 3 may comprise one or more optional additional features corresponding to one or more aspects mentioned in connection with the proposed concept or one or more embodiments described above (e.g. FIG. 1 or 2) or below (e.g. FIG. 4).

Figure 4:
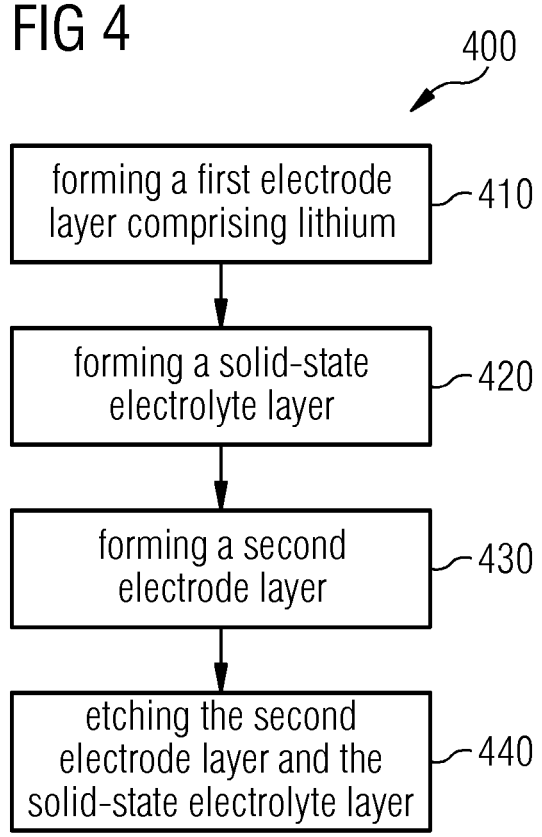
FIG. 4 shows a flow chart of a method for forming a memory circuit according to an embodiment.

FIG. 4 shows a method 400 for forming a memory circuit according to an embodiment.

The method 400 includes forming 410 a first electrode layer including lithium over a substrate surface.

The method 400 further includes forming 420 a solid-state electrolyte layer over the first electrode layer.

The method 400 further includes forming 430 a second electrode layer over the solid state electrolyte.

The method 400 further includes etching 440 the second electrode layer and the solid-state electrolyte layer so that at least one memory element stack of a memory element remains.

The substrate surface may be a surface of a semiconductor substrate or wafer, for example. The semiconductor substrate may include one or more ASIC circuits or at least part of a memory access circuit formed in the substrate, for example.

The first electrode layer may be formed over a first collector (or barrier) layer for example. Furthermore, a second collector (or barrier) layer may be formed over the second electrode layer for example.

An electrically insulating layer may be deposited over (e.g. directly on) the substrate surface. For example, the electrically insulating layer may be formed at the substrate surface level. The first electrode layer, the solid-state electrolyte layer and the second electrode layer may be formed over the wafer and may cover a substantial portion of the semiconductor substrate surface, for example. Various deposition methods such as chemical vapor deposition, evaporation, sputtering may be used for the deposition of the layers, for example.

Etching of the layers may be carried out so that one or more memory element stacks may remain. For example, various photolithography and etching methods (e.g. wet or dry chemical etching) may be carried out. One or more trenches may be formed in the layers at predefined locations for example. The trenches may be formed by the etching or removal of parts of the second collector layer, the second electrode layer, and the solid-state electrolyte layer at the predefined locations. The trenches may have a depth of about h and may extend from the second collector layer to the solid-state electrolyte layer, for example. An array of memory element stacks may remain in the regions where the second collector layer, second electrode layer and parts of the solid-state electrolyte layer are not removed, for example. Additionally, etching the second collector layer, the second electrode layer and the solid-state electrolyte layer may be carried out so that at least a battery element stack of a battery element may remain and at least one memory element stack of the memory element remain. For example, one or more deposition and/or etching processes may be used jointly or in common for the formation of the memory element and the battery element, for example.

After the formation of the memory element stack and/or the battery element stack, an isolation material may be deposited to electrically insulate or surround the memory element stack from its surroundings. The isolation material (including or consisting of at least one of silicon dioxide and silicon nitride) may be deposited using chemical vapor deposition processes or other suitable deposition processes, for example. Subsequently, one or more wiring layers may be formed. For example, a first layer or level of electrically conductive lines (e.g. a set of word lines) may be structured, electrically conductive material may be deposited, and the lines may be electrically isolated from its surroundings. Subsequently, a second layer or level of and electrically conductive lines (e.g. a set of bit lines) may be structured, electrically conductive material may be deposited, and the lines may be electrically isolated from its surroundings, for example.

Due to the formation of a memory element comprising solid-state films forming the electrode layers and the electrolyte layer, deposition methods used in complementary metal oxide semiconductor (CMOS) technology may be used for the formation of the memory element, for example. As the materials used for forming the memory element may also be used for forming a battery element, one or more deposition or etching processes may be shared or jointly used for the formation of the memory element and the battery element, for example. This may result in reduced costs, for example.

More details and aspects are mentioned in connection with the embodiments described above or below (e.g. regarding the imaging device, the image sensor circuit, the pixel element, the pixel image data and the image processing circuit). The embodiment shown in FIG. 4 may comprise one or more optional additional features corresponding to one or more aspects mentioned in connection with the proposed concept or one or more embodiments described above (e.g. FIGS. 1 to 3) or below.

Various embodiments related to a lithium random access memory (RAM). Solid state thin film technology may be used to create a memory, for example. Memory systems may be replaced by lithium RAM, for example. Batteries, e.g. lithium batteries, may also be integrated into the system, for example. Lithium based memories may be used alternatively or additionally to dynamic random access memory (DRAM), flash memory, static random access memory (SRAM), magnetoresistive random access memory (MRAM), and phase change random access memory (PCRAM), for example.

Various embodiments related to a new type of RAM using all solid state thin film battery technology to create an array of memory cells. Random write and read access may be possible, for example.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A memory circuit, comprising:
   a memory element comprising a first electrode layer comprising lithium formed over a substrate, a second electrode layer and a solid-state electrolyte layer arranged between the first electrode layer and the second electrode layer;
   a contact via extending through the first electrode layer, the solid-state electrolyte layer and the second electrode layer to provide electrical contact with the substrate; and
   a memory access circuit configured to determine a memory state of the memory element,
   wherein the memory element is configured to switch to one of at least three predefined memory states based on a transport of ions to the first electrode layer or the second electrode layer via the solid-state electrolyte layer.

2. The memory circuit of claim 1, wherein the memory element has a lateral size of less than 1 µm$^2$.

3. The memory circuit of claim 1, wherein the memory element is configured to switch to a predefined memory state based on a predefined write bias level applied by the memory access circuit between the first electrode layer and the second electrode layer.

4. The memory circuit of claim 1, wherein the second electrode layer comprises a plurality of crystalline layers, and wherein ions collected at the second electrode layer are intercalated in the plurality of crystalline layers.

5. The memory circuit of claim 1, wherein the memory element and the memory access circuit are formed in a common semiconductor die.

6. The memory circuit of claim 1, wherein the first electrode layer comprises lithium cobalt oxide.

7. The memory circuit of claim 1, wherein the second electrode layer comprises carbon or silicon.

8. The memory circuit of claim 1, wherein the solid-state electrolyte layer comprises lithium phosphorus oxynitride.

9. The memory circuit of claim 1, further comprising:
   a first collector layer in contact with the first electrode layer; and
   a second collector layer in contact with the second electrode layer,
   wherein the first collector layer and the second collector layer comprise titanium nitride or tungsten nitride.

10. The memory circuit of claim 1, further comprising:
    an access transistor coupled to the memory element,
    wherein the memory access circuit is configured to individually address the memory element by applying a selection control signal to a control terminal of the access transistor.

11. The memory circuit of claim 10, wherein the access transistor coupled to the memory element comprises:
    a first terminal coupled to a reference potential or a bias generator circuit; and
    a second terminal coupled to the first electrode layer of the memory element or the second electrode layer of the memory element.

12. The memory circuit of claim 1, wherein the memory access circuit comprises a sensing circuit configured to determine a memory state of the memory element based on a voltage present between the first electrode layer and the second electrode layer.

13. The memory circuit of claim 1, further comprising:
    a plurality of memory elements arranged in an array, each memory element comprising a first electrode layer comprising lithium, a second electrode layer and a solid-state electrolyte layer between the first electrode layer and the second electrode layer.

14. The memory circuit of claim 13, wherein the memory access circuit comprises an addressing circuit configured to trigger a selection of one or more memory elements of the memory array.

15. The memory circuit of claim 13, wherein the memory access circuit comprises:
    a bias generator circuit; and
    a set of word lines and a set of bit lines;
    wherein the bias generator circuit is configured to provide a selection control signal to a selected one of the memory elements via a designated word line, and to provide a bias signal to the selected memory element via a designated bit line.

16. The memory circuit of claim 15, wherein the bias generator circuit is configured to provide the bias signal to the selected memory element or to a terminal of an access transistor coupled to the selected memory element so as to switch the selected memory element from a first predefined memory state to a second predefined memory state based on a predefined bias level of the bias signal.

17. A memory circuit of claim 1, further comprising:
    a battery element configured to provide stored charge to at least the memory access circuit to supply energy for determining the memory state of the memory element.

18. A method for forming a memory circuit, the method comprising:
    forming a first electrode layer comprising lithium over a substrate surface;
    forming a solid-state electrolyte layer over the first electrode layer;
    forming a second electrode layer over the solid state electrolyte;
    etching the second electrode layer and the solid-state electrolyte layer so that at least one memory element stack of a memory element remains, wherein the memory element stack comprises at least part of the solid-state electrolyte layer and the second electrode layer; and
    forming a contact via that extends through the first electrode layer, the solid-state electrolyte layer and the second electrode layer to provide electrical contact with the substrate.

19. The method of claim 18, wherein the etching of the second electrode layer and the solid-state electrolyte layer is carried out so that at least a battery element stack of a battery element and the least one memory element stack remain.

* * * * *

UNITED STATES PATENT AND TRADEMARK OFFICE
CERTIFICATE OF CORRECTION

PATENT NO. : 10,748,587 B2  
APPLICATION NO. : 14/843484  
DATED : August 18, 2020  
INVENTOR(S) : M. Lemke Page 1 of 1

It is certified that error appears in the above-identified patent and that said Letters Patent is hereby corrected as shown below:

In the Claims

Column 19, Line 4 (Claim 19, Line 4) please change "the least" to -- the at least --

Signed and Sealed this  
First Day of March, 2022

Drew Hirshfeld  
*Performing the Functions and Duties of the*  
*Under Secretary of Commerce for Intellectual Property and*  
*Director of the United States Patent and Trademark Office*